United States Patent
Huang et al.

(10) Patent No.: US 8,891,585 B2
(45) Date of Patent: Nov. 18, 2014

(54) HEATING ELECTRODE ASSEMBLY FOR CRYSTAL GROWTH FURNACE

(71) Applicant: UTECH Solar Corporation, Miaoli (TW)

(72) Inventors: Chih-Wei Huang, Miaoli (TW); Jen-Min Shao, Miaoli (TW); An-Chun Liu, Miaoli (TW)

(73) Assignee: UTECH Solar Corporation (TW)

( * ) Notice: Subject to any disclaimer, the term of this patent is extended or adjusted under 35 U.S.C. 154(b) by 0 days.

(21) Appl. No.: 13/937,908

(22) Filed: Jul. 9, 2013

(65) Prior Publication Data
US 2014/0023106 A1    Jan. 23, 2014

(30) Foreign Application Priority Data
Jul. 17, 2012 (TW) .............................. 101213719 U

(51) Int. Cl.
| | |
|---|---|
| H05B 3/14 | (2006.01) |
| F27D 1/00 | (2006.01) |
| C30B 35/00 | (2006.01) |
| C30B 15/00 | (2006.01) |
| H05B 3/66 | (2006.01) |
| F27B 14/06 | (2006.01) |
| H05B 3/03 | (2006.01) |

(52) U.S. Cl.
CPC H05B 3/66 (2013.01); F27B 14/06 (2013.01); H05B 3/03 (2013.01); C30B 35/00 (2013.01)
USPC ............ 373/132; 373/137; 117/200; 117/217

(58) Field of Classification Search
CPC .......... H05B 3/03; H05B 3/66; C30B 11/002; C30B 11/003; C30B 29/06; C30B 28/06; F27B 14/06
USPC ........ 373/109, 110, 111, 114, 117, 118, 119, 373/122, 125, 127, 128, 132, 130, 137; 117/206, 213, 215, 217, 911, 200, 204, 117/222; 219/532, 536, 531, 538
See application file for complete search history.

(56) References Cited

U.S. PATENT DOCUMENTS

| | | | | |
|---|---|---|---|---|
| 4,559,631 | A | * | 12/1985 | Moller .......................... 373/130 |
| 5,098,675 | A | * | 3/1992 | Matsuo et al. ................ 117/213 |
| 2003/0213525 | A1 | * | 11/2003 | Patel et al. .................... 138/149 |
| 2004/0182321 | A1 | * | 9/2004 | Kuibira et al. ................ 118/728 |
| 2009/0188426 | A1 | * | 7/2009 | Lew et al. ...................... 117/206 |

FOREIGN PATENT DOCUMENTS

CN           202107794 U        1/2012

* cited by examiner

*Primary Examiner* — Henry Yuen
*Assistant Examiner* — Hung D Nguyen
(74) *Attorney, Agent, or Firm* — Ohlandt, Greeley, Ruggiero & Perle, L.L.P.

(57) ABSTRACT

A heating electrode assembly for a crystal growth furnace includes: a heat insulation board unit that is disposed between a furnace wall and a heater, that includes a first surface facing the furnace wall and a second surface facing the heater, and that is formed with a hole extending through the first surface and the second surface; an electrode unit that includes an electricity input portion mounted to the furnace wall, a post portion disposed in the hole, and an abutment flange connecting the post portion and the heater; and an electrical insulating unit including a tubular sleeve that is disposed in the hole and that surrounds the post portion, and a pad that is clamped between the abutment flange and the second surface.

8 Claims, 5 Drawing Sheets

HEATING ELECTRODE ASSEMBLY FOR CRYSTAL GROWTH FURNACE

CROSS REFERENCE TO RELATED APPLICATION

This application claims priority of Taiwanese Patent Application no. 101213719, filed on Jul. 17, 2012.

BACKGROUND OF THE INVENTION

1. Field of the Invention

The invention relates to a crystal growth furnace, more particularly to a heating electrode assembly for a crystal growth furnace.

2. Description of the Related Art

As shown in FIG. 1, Taiwanese Patent No. 1346152 discloses a conventional crystal growth furnace 1 that includes: an upper furnace wall 11, a bottom cover 12 for closing a bottom part of the upper furnace wall 11, a heat insulation unit 13 disposed in the upper furnace wall 11 and the bottom cover 12, a load board 14 disposed in the heat insulation unit 13, a plurality of electrode units 15, and a plurality of resistive graphite heaters 16. Each of the electrode units 15 has a metal electrode column 151 fixed on the upper furnace wall 11 and a graphite electrode column 152 that extends downwardly from the metal electrode column 151 through the heat insulation unit 13. The graphite electrode column 152 of each of the electrode units 15 has a bottom portion connected to a respective one of the graphite heaters 16.

When growing a polycrystalline silicon crystal, a silicon raw material (not shown in the Figure) is placed in a crucible 17 on the load board 14. Then, a high-current low-voltage electric power is provided to the metal electrode columns 151 through a plurality of cables 18 (only one cable is shown in FIG. 1) which are externally connected to the conventional crystal growth furnace 1, so that large currents flow in sequence from the metal electrode columns 151 through the graphite electrode columns 152 to the graphite heaters 16, generating a thermal field within the heat insulation unit 13 so as to melt the silicon raw material in the crucible 17 into a molten silicon 19.

However, it should be noted herein that, since the heat insulation unit 13 is generally made of conductive material, such as graphite, carbon fiber, etc., and in the conventional crystal growth furnace 1 there is no electrical insulation between the graphite electrode columns 152 of each of the electrode units 15 and the heat insulating unit 13, electrical arcs may be formed between the graphite electrode columns 152 and the heat insulation unit 13 under large currents. Such electrical arcs can cause damage to the heat insulation unit 13. Therefore, when the conventional crystal growth furnace 1 has been in use for a long period of time, the burning of the heat insulation unit 13 by the electrical arcs will inevitably result in variation of the thermal field within the conventional crystal growth furnace 1, and will adversely affect the quality of a grown crystal.

Referring to FIG. 2, China Patent Publication No. CN202107794U discloses a conventional polycrystalline crystal growth furnace 2 that comprises: a furnace 21, a heat insulation cage 22 disposed in the furnace 21, a heat insulation top plate 23 disposed at a top portion of the heat insulation cage 22, a plurality of electrode units 24 extending through the heat insulation top plate 23, and a heater 25 connected to the electrode units 24. However, there is not shown any design of electrical isolation between each of the electrode units 24 and the heat insulation top plate 23 of the conventional polycrystalline crystal growth furnace 2. Therefore, similar to the conventional crystal growth furnace 1, the conventional polycrystalline crystal growth furnace 2 also suffers from the burning problem of the heat insulation top plate 23 which is caused by the electrical arcs, and which results in variation of the thermal field within the conventional crystal growth furnace 2, so as to adversely affect the quality of the grown crystal.

From the foregoing, it is evident that improvement on the structure of the heating electrode assembly, which may ameliorate the burning problem of the heat insulation boards and improve the quality of grown crystal, is highly desired in this technical field.

SUMMARY OF THE INVENTION

Therefore, the object of the present invention is to provide a heating electrode assembly that may alleviate the aforementioned drawback of the prior art.

According to the present invention, a heating electrode assembly for a crystal growth furnace, which includes a furnace wall and a heater disposed in the furnace wall, includes:

a heat insulation board unit that is adapted to be disposed between the furnace wall and the heater, that includes a first surface to be disposed so as to face the furnace wall, and a second surface to be disposed so as to face the heater, and that is formed with a through hole extending through the first surface and the second surface;

an electrode unit that includes an electricity input portion which is adapted to be mounted to the furnace wall, a post portion which is axially disposed in the through hole of the heat insulation board unit, and an abutment flange which is connected to the post portion, which is disposed adjacent to the second surface of the heat insulation board unit, and which is adapted for connecting to the heater; and an electrical insulating unit that includes an electrical insulating tubular sleeve which is axially disposed in the through hole and which surrounds the post portion of the electrode unit, and an electrical insulating pad which is clamped between the abutment flange of the electrode unit and the second surface of the heat insulation board unit.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
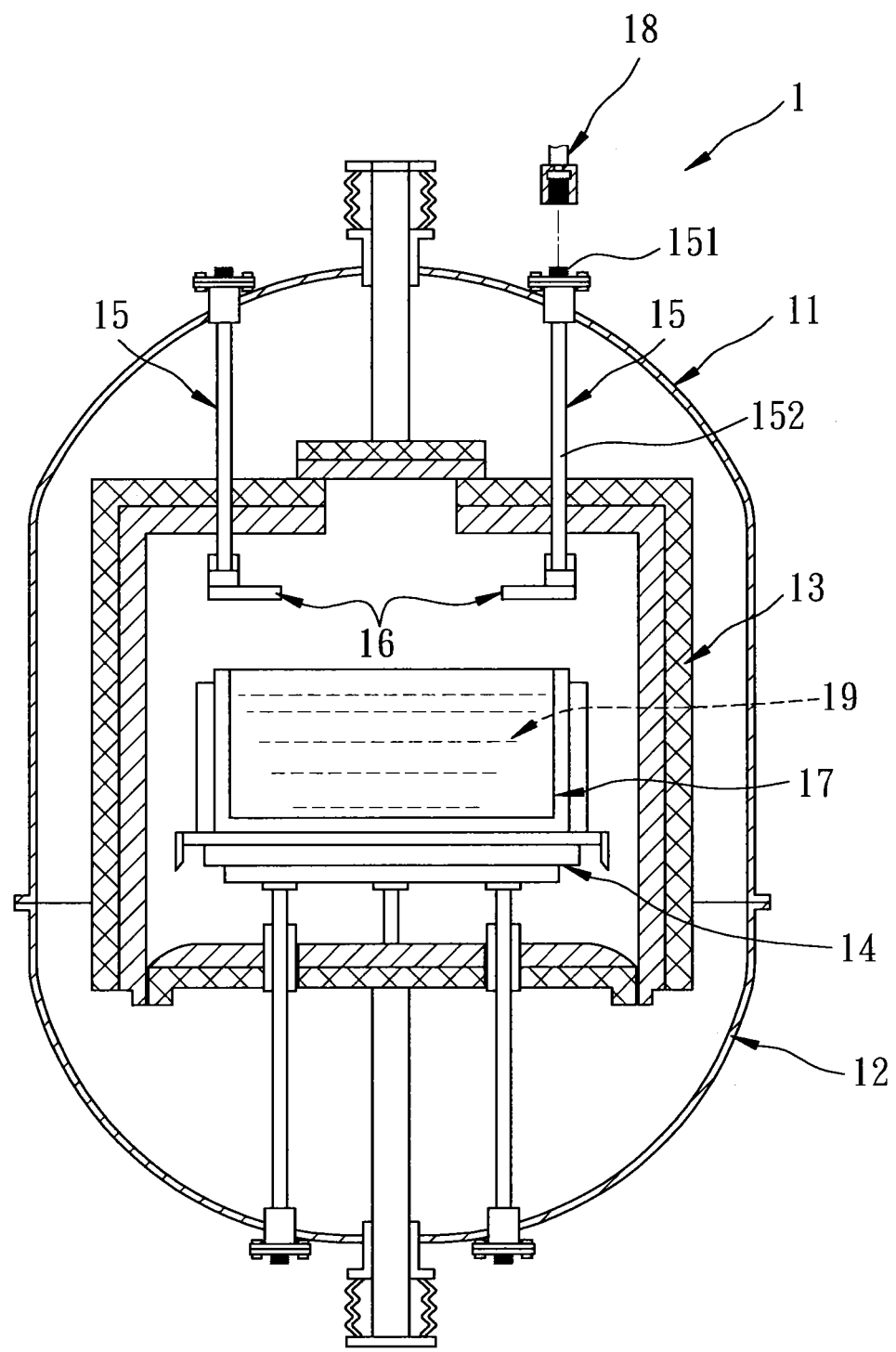
FIG. 1 is a partly sectional view of a conventional crystal growth furnace disclosed in Taiwanese Patent No. 1346152.
Figure 2:
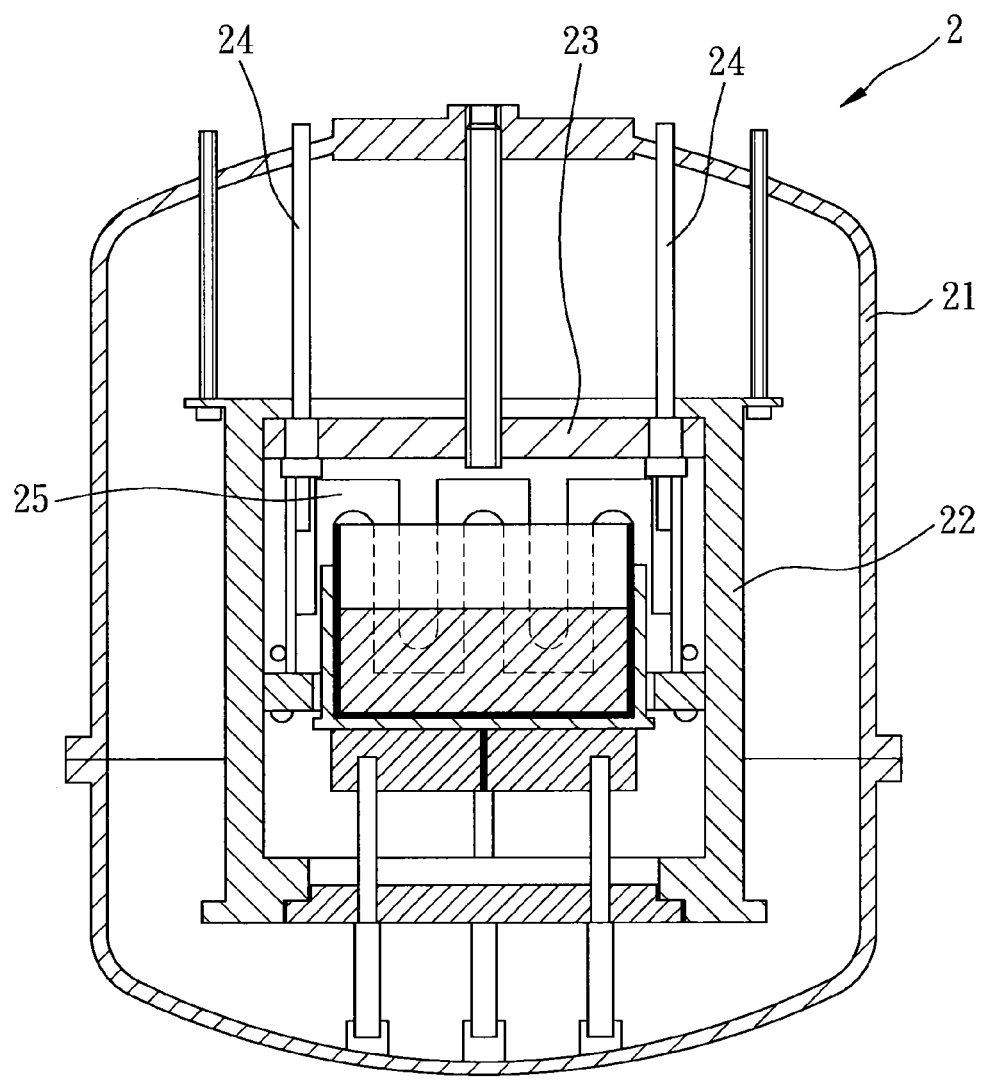
FIG. 2 is a partly sectional view of a conventional polycrystalline crystal growth furnace disclosed in China Patent Publication No. CN202107794 U.
Figure 3:
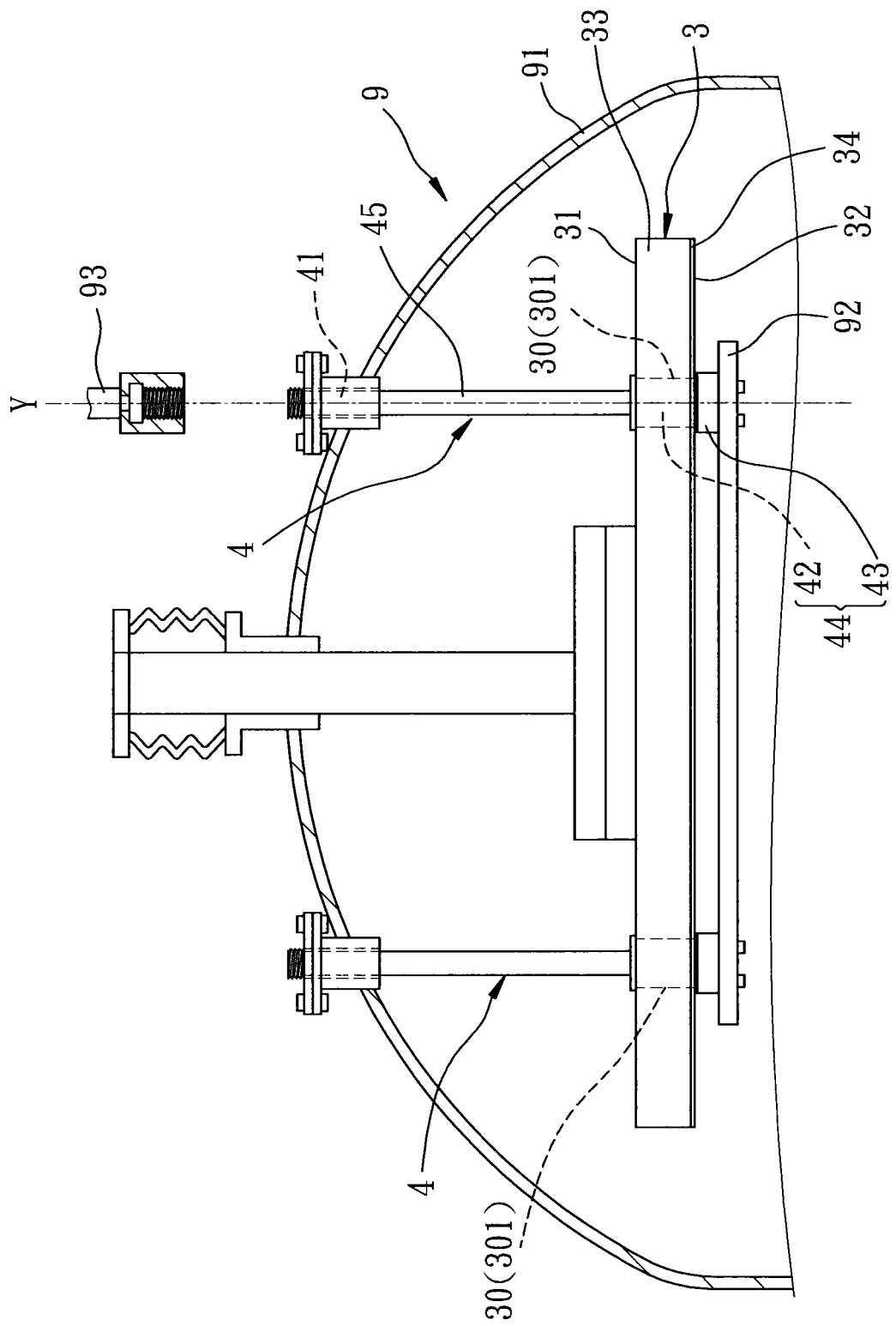
FIG. 3 is a fragmentary partly sectional view of the preferred embodiment of a heating electrode assembly for a crystal growth furnace according to the present invention.
Figure 4:
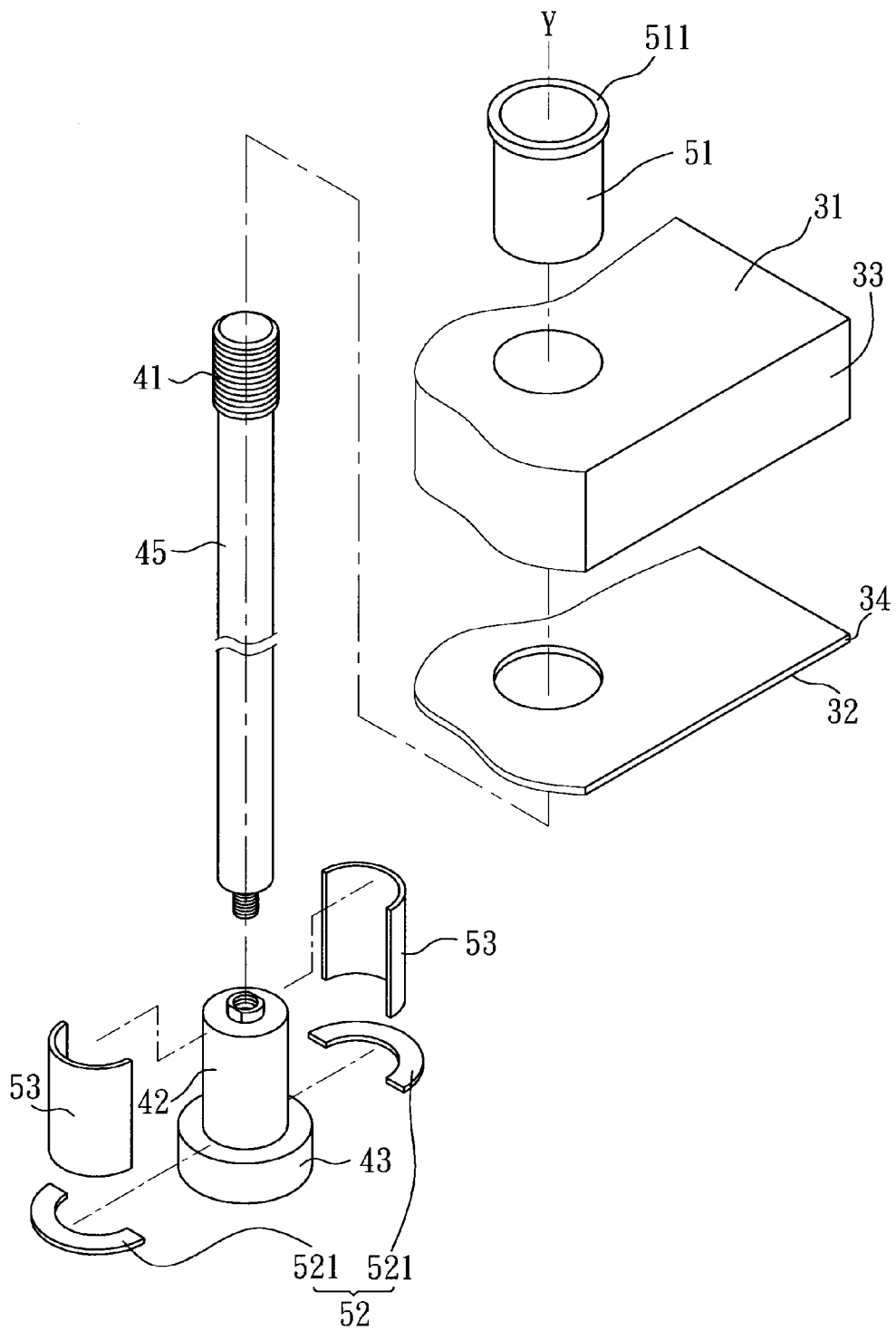
FIG. 4 is a partly exploded perspective view of the preferred embodiment.
Figure 5:
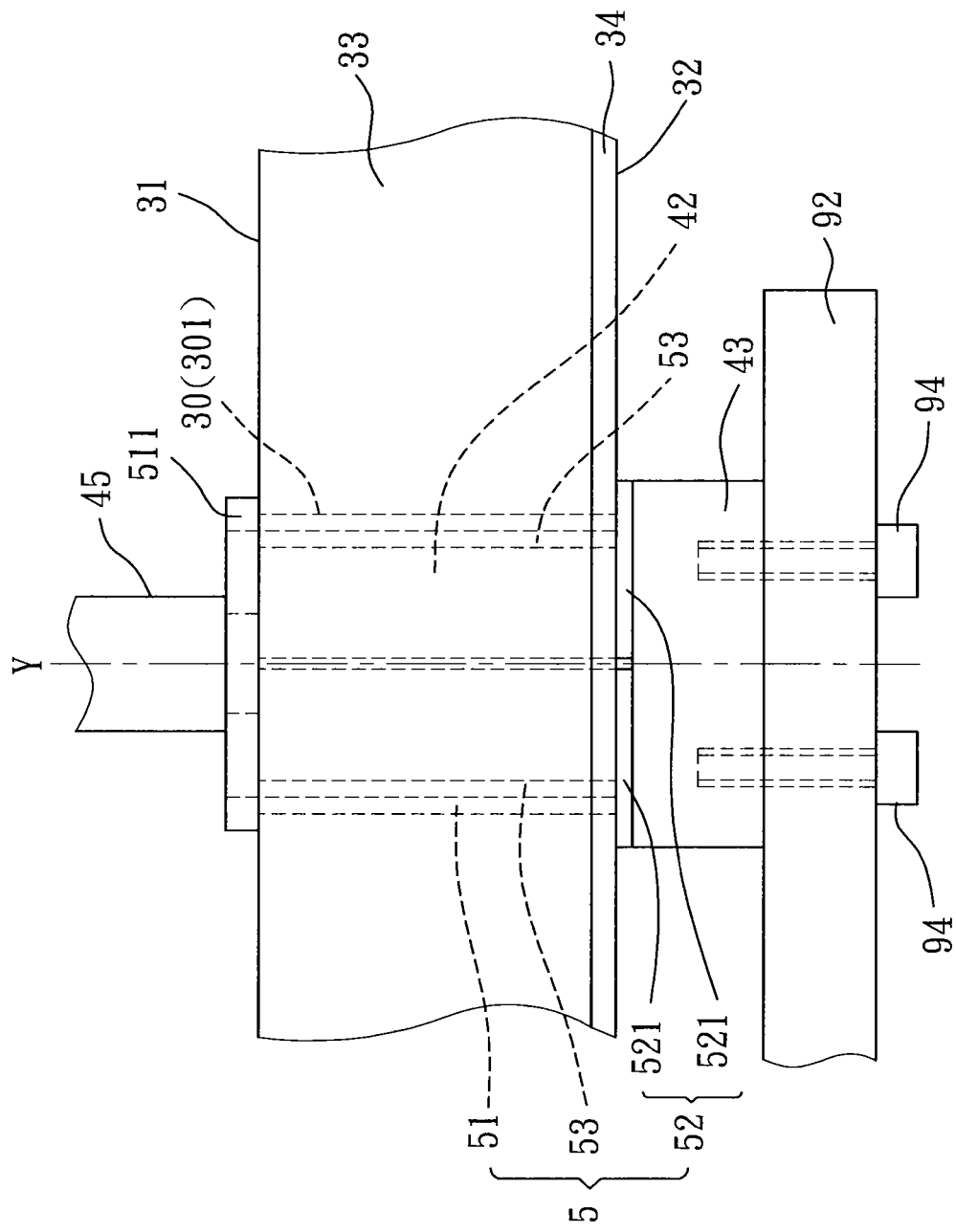
FIG. 5 is a fragmentary enlarged side view of the preferred embodiment shown in FIG. 3.

Referring to FIGS. 3 to 5, the preferred embodiment of a heating electrode assembly for a crystal growth furnace 9 according to the present invention is shown to include a heat insulation board unit 3, a plurality of electrode units 4, and a plurality of electrical insulating units 5 corresponding in number to the number of the electrode units 4.

The heat insulation board unit 3 is adapted to be disposed between a furnace wall 91 and a graphite heater 92 of the crystal growth furnace 9, includes a first surface 31 to be disposed so as to face the furnace wall 91 and a second surface 32 to be disposed so as to face the heater 92, and is formed with a plurality of through holes 30, each of which extends through the first surface 31 and the second surface 32 and is defined by an inner circumferential surface 301. In this preferred embodiment, the heat insulation board unit 3 includes a first board member 33 and a second board member 34 that has the first board member 33 stacked thereon. The first board member 33 has the first surface 31, and the second board member 34 has the second surface 32. In this embodiment, each of the first and second board members 33, 34 comprises a carbon fiber material, and the density of the second board member 34 is greater than that of the first board member 33. In this embodiment, the second board member 34 of the heat insulation board unit 3 is made of a carbon/carbon composite material (CCM), which is generally a high density carbon fiber plate made by combining a variety of carbon materials through a multilayer compressing process.

Each of the electrode units 4 includes an electricity input potion 41 which is adapted to be mounted to the furnace wall 91, a post portion 42 which is axially disposed along an axis (Y) in a respective one of the through holes 30 of the heat insulation board unit 3, and an abutment flange 43 which is connected to the post portion 42, which is disposed adjacent to the second surface 32 of the heat insulation board unit 3, and which is adapted for connecting to the heater 92. In this embodiment, the abutment flanges 43 are connected to the heater 92 by a plurality of graphite screws 94. The abutment flanges 43 of the electrode units 4 permit the heat insulation board unit 3 to be suspended in the crystal growth furnace 9. In this embodiment, each of the electrode units 4 further includes a metal column segment 45 that extends from the post portion 42 toward the furnace wall 91 and that is provided with the electricity input portion 41, and a graphite post segment 44 that is provided with the post portion 42 and the abutment flange 43.

In this embodiment, the metal column segment 45 of each of the electrode units 4 is made of copper (Cu). An external power supply (not shown in the Figure) provides a high-current and low-voltage electric power through a plurality of cables 93 (only one cable is shown in FIG. 3) to the respective electricity input portions 41 of the metal column segments 45 of the electrode units 4, so that large currents flow in sequence through the graphite post segments 44 to the heater 92 connected therebelow for generating heat. Moreover, the second board member 34 of the heat insulation board unit 3 is capable of reflecting and blocking heat radiated from the heater 92 so as to maintain a uniform thermal field.

Each of the electrical insulating units 5 includes an electrical insulating tubular sleeve 51, and an electrical insulating pad 52.

Each of the electrical insulating tubular sleeves 51 is axially disposed in a respective one of the through holes 30 along the axis (Y) and surrounds the post portion 42 of a respective one of the electrode units 4 in a manner that a continuous electrical insulation is provided at the inner circumferential surface 301. In this embodiment, each of the electrical insulating tubular sleeves 51 has a stop flange 511 that abuts against the first surface 31 of the heat insulation board unit 3 for preventing dust from dropping through the through holes 30 and polluting a molten silicon (not shown in Figure) which is disposed below the heater 92. Preferably, the electrical insulating tubular sleeve 51 has a Mohs hardness ranging from 2 to 9, and is capable of enduring temperatures higher than 1800° C. In this preferred embodiment, the electrical insulating tubular sleeve 51 is made of an aluminum oxide material.

Each of the electrical insulating pads 52 is clamped between the abutment flange 43 of the respective one of the electrode units 4 and the second surface 32 of the heat insulation board unit 3. In this embodiment, each of the electrical insulating pads 52 includes a pair of C-shaped insulating pad parts 521 that are assembled to form the electrical insulating pad 52.

In this embodiment, each of the electrical insulating units 5 may further include a pair of insulating lining parts 53 that are semi-circular arcs in cross-section so as to be complementary in shape and that are assembled to form a cylindrical insulating lining. The cylindrical insulating lining is axially disposed in the respective one of the through holes 30 along the axis (Y) and is fitted between the corresponding electrical insulating tubular sleeve 51 and the post portion 42 of a respective one of the electrode units 4. The insulating lining parts 53 may be omitted in other embodiments of this invention.

The electrical insulating lining parts 53 and the C-shaped insulating pad parts 521 provide primary electrical insulation for the inner circumferential surfaces 301 and parts of the second surface 32 of the heat insulation board unit 3 which are adjacent to the electrode units 4, and the electrical insulating tubular sleeves 51 sleeved on the cylindrical insulating linings prevent generation of electrical arcs through gaps between each pair of the electrical insulating lining parts 53, so as to achieve complete electrical insulation of the heat insulation board unit 3 and to prevent the heat insulation board unit 3 from being damaged by the electrical arcs.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A heating electrode assembly for a crystal growth furnace, the crystal growth furnace including a furnace wall and a heater disposed in the furnace wall, said heating electrode assembly comprising:
   a heat insulation board unit that is adapted to be disposed between the furnace wall and the heater, that includes a first surface to be disposed so as to face the furnace wall, and a second surface to be disposed so as to face the heater, and that is formed with a through hole extending through said first surface and said second surface;
   an electrode unit that includes an electricity input portion which is adapted to be mounted to the furnace wall, a post portion which is axially disposed in said through hole of said heat insulation board unit, and an abutment flange which is connected to said post portion, which is disposed adjacent to said second surface of said heat insulation board unit, and which is adapted for connecting to the heater;
   an electrical insulating unit that includes an electrical insulating tubular sleeve which is axially disposed in said through hole and which surrounds said post portion of said electrode unit, and an electrical insulating pad which is clamped between said abutment flange of said electrode unit and said second surface of said heat insulation board unit; and wherein said electrical insulating unit further includes a pair of insulating lining parts that are complementary in shape and that are assembled to form a cylindrical insulating lining which is axially disposed in said through hole, and which is fitted between said electrical insulating tubular sleeve and said post portion of said electrode unit.

2. The heating electrode assembly as claimed in claim 1, wherein said electrical insulating tubular sleeve has a stop flange that abuts against said first surface of said heat insulation board unit.

3. The heating electrode assembly as claimed in claim 1, wherein said electrical insulating pad includes a pair of C-shaped insulating pad parts that are assembled to form said electrical insulating pad.

4. The heating electrode assembly as claimed in claim 1, wherein said electrode unit further includes a metal pillar segment that extends from said post portion and that is provided with said electricity input portion, and a graphite post segment that is provided with said post portion and said abutment flange.

5. The heating electrode assembly as claimed in claim 1, wherein said heat insulation board unit includes a first board member and a second board member that has said first board member stacked thereon, said first board member having said first surface, said second board member having said second surface.

6. The heating electrode assembly as claimed in claim 5, wherein each of said first board member and said second board member comprises a carbon fiber material, and the density of said second board member is greater than that of said first board member.

7. The heating electrode assembly as claimed in claim 1, wherein said electrical insulating tubular sleeve is made of an aluminum oxide material.

8. The heating electrode assembly as claimed in claim 1, wherein said heat insulating board unit is formed with a plurality of said through holes, and said heating electrode assembly comprises a plurality of said electrode units and said electrical insulating units that correspond respectively to said through holes of said heat insulation board unit.

* * * * *